US012800630B2

(12) United States Patent
La Rosa

(10) Patent No.: US 12,800,630 B2
(45) Date of Patent: Nov. 17, 2026

(54) RESISTANCE-BASED SENSING SYSTEM CONFIGURED FOR LOW-ENERGY CONSUMPTION

(71) Applicant: STMicroelectronics International N.V., Geneva (CH)

(72) Inventor: Roberto La Rosa, Catania (IT)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 303 days.

(21) Appl. No.: 18/592,941

(22) Filed: Mar. 1, 2024

(65) Prior Publication Data

US 2025/0277833 A1 Sep. 4, 2025

(51) Int. Cl.
*G01R 27/02* (2006.01)
*G01D 5/16* (2006.01)
*G01R 17/02* (2006.01)

(52) U.S. Cl.
CPC ............. *G01R 27/02* (2013.01); *G01R 17/02* (2013.01); *G01D 5/16* (2013.01)

(58) Field of Classification Search
CPC ........... G01R 27/02; G01R 17/02; G01D 5/16
USPC .......................................................... 324/691
See application file for complete search history.

(56) References Cited

U.S. PATENT DOCUMENTS 7,781,943 B1 8/2010 Hamel et al.
9,653,926 B2 5/2017 Park et al.
10,630,078 B2 4/2020 Amin et al.
10,746,680 B2 8/2020 Potyrailo et al.
2003/0020466 A1* 1/2003 Lewis .................. G01L 9/0029 324/207.21
2005/0151534 A1* 7/2005 Omekanda ............. G01D 5/145 324/207.2
2013/0278247 A1* 10/2013 Kunjappan ............ G01R 33/07 324/207.2
2014/0343701 A1* 11/2014 Song ...................... A63B 71/10 700/92
2016/0197508 A1 7/2016 Kruiskamp
2017/0183034 A1* 6/2017 Hong ....................... G01D 5/16
(Continued)

FOREIGN PATENT DOCUMENTS

WO WO 2020/114944 A2 6/2020

*Primary Examiner* — Raul J Rios Russo
(74) *Attorney, Agent, or Firm* — Alston & Bird LLP

(57) ABSTRACT

An example apparatus, computer-implemented method, and computer program product for determining a variable resistance of a conductive portion of a resistance-based sensing device are provided. An example apparatus includes a resistance-based sensing device having a conductive portion configured to indicate a physical characteristic of an environment based on a variable resistance of the conductive portion. The apparatus further includes a controller electrically coupled to the resistance-based sensing device, having a process and a storage device storing instructions that are operable, when executed by the processor, to cause the processor to transmit stored energy from an energy storage device to the conductive portion of the resistance-based sensing device, determine a time interval associated with a voltage drop in the energy storage device, and determine the variable resistance of the conductive portion of the resistance-based sensing device based at least in part on the time interval.

19 Claims, 8 Drawing Sheets

(56) References Cited

U.S. PATENT DOCUMENTS

| | | | | |
|---|---|---|---|---|
| 2018/0335294 | A1* | 11/2018 | Ausserlechner ......... | G01B 7/30 |
| 2020/0049482 | A1* | 2/2020 | Ives ..................... | G01D 5/2006 |
| 2022/0321140 | A1* | 10/2022 | Moeneclaey ......... | H03M 1/468 |
| 2023/0027724 | A1* | 1/2023 | La Rosa ............... | H04W 8/245 |

* cited by examiner

RESISTANCE-BASED SENSING SYSTEM CONFIGURED FOR LOW-ENERGY CONSUMPTION

TECHNOLOGICAL FIELD

Embodiments of the present disclosure relate generally to resistance-based sensing systems, and more particularly, to a resistance-based sensing system configured for low-energy consumption.

BACKGROUND

Many sensors utilize a change in resistance to determine a physical characteristic of a surrounding environment. For example, due to the piezoresistive effect, the electrical resistance of a material may change when subject to mechanical strain. Utilizing the piezoresistive effect pressure sensors, strain gauges, and other sensors may be designed to measure the change in resistance and convert the resistance into a physical measurement. In addition, temperature sensors, such as a resistance thermometer, may utilize changes in the resistance of a conductive material to determine the temperature in a surrounding environment.

Applicant has identified many technical challenges and difficulties associated with determining the physical characteristics of an environment based on a variable resistance. Through applied effort, ingenuity, and innovation, Applicant has solved problems related to determining physical characteristics of an environment based on a variable resistance by developing solutions embodied in the present disclosure, which are described in detail below.

BRIEF SUMMARY

Various embodiments are directed to an example apparatus, computer-implemented method, and computer program product for determining a variable resistance of a conductive portion of a resistance-based sensing device. An example apparatus may comprise a resistance-based sensing device comprising a conductive portion configured to indicate a physical characteristic of an environment based on a variable resistance of the conductive portion. The example apparatus may further comprise a controller electrically coupled to the resistance-based sensing device, comprising one or more processors and one or more storage devices storing instructions that are operable, when executed by the one or more processors, to cause the one or more processors to transmit stored energy from an energy storage device to the conductive portion of the resistance-based sensing device; determine a time interval associated with a voltage drop in the energy storage device; and determine the variable resistance of the conductive portion of the resistance-based sensing device based at least in part on the time interval.

In some embodiments, the apparatus further comprises an energy harvester configured to generate harvested energy and transmit the harvested energy to the energy storage device.

In some embodiments, the energy harvester generates the harvested energy from a natural power source.

In some embodiments, the natural power source is at least one of solar power, thermal energy, wind energy, and vibration energy.

In some embodiments, the physical characteristic indicated by the resistance-based sensing device is at least one of pressure, stress, temperature, and light.

In some embodiments, the apparatus further comprises a low power timer electrically coupled to the controller and configured to generate a count value based on a clock frequency of the controller.

In some embodiments, the time interval is determined based on the count value.

In some embodiments, the apparatus further comprises a power voltage detector electrically coupled to the controller and configured to determine a voltage value in the energy storage device.

In some embodiments, the voltage drop corresponds to a difference between a first voltage value determined by the power voltage detector and a second voltage value.

In some embodiments, the second voltage value is associated with a minimum operating voltage of the controller.

In some embodiments, the apparatus further comprises a reference resistor having a known resistance value.

In some embodiments, the variable resistance of the conductive portion of the resistance-based sensing device is determined based at least in part on a reference time interval associated with a reference voltage drop in the energy storage device in an instance in which the stored energy from the energy storage device is transmitted to the reference resistor.

In some embodiments, the apparatus further comprises a transceiver radio electrically coupled to the controller.

In some embodiments, the time interval representing the variable resistance of the conductive portion of the resistance-based sensing device is transmitted by the transceiver radio.

In some embodiments, the variable resistance of the conductive portion of the resistance-based sensing device is determined without the use of an analog-to-digital converter.

A computer-implemented method for determining a variable resistance of a conductive portion of a resistance-based sensing device is further provided. In some embodiments, the computer-implemented method comprising: transmitting, by a controller, stored energy from an energy storage device to the conductive portion of the resistance-based sensing device; determining a time interval associated with a voltage drop in the energy storage device; and determining the variable resistance of the conductive portion of the resistance-based sensing device based at least in part on the time interval.

In some embodiments, the computer-implemented method further comprises determining a count value based on a low power timer electrically coupled to the controller and configured to increment the count value based on a clock frequency of the controller, wherein the time interval is determined based on the count value.

In some embodiments, the computer-implemented method further comprises a power voltage detector electrically coupled to the controller and configured to determine a voltage value in the energy storage device.

In some embodiments, the computer-implemented method further comprises determining, by the power voltage detector, a first voltage value and a second voltage value, wherein the voltage drop corresponds to a difference between the first voltage value and the second voltage value, and wherein the second voltage value is associated with a minimum operating voltage of the controller.

A computer program product for determining a variable resistance of a conductive portion of a resistance-based sensing device is further provided. In some embodiments, the computer program product comprises at least one non-transitory computer-readable storage medium having computer-readable program code portions stored therein, the computer-readable program code portions comprising an executable portion configured to: transmit, by a controller, stored energy from an energy storage device to the conductive portion of the resistance-based sensing device; determine a count value based on a low power timer electrically coupled to the controller and configured to increment the count value based on a clock frequency of the controller; determine a time interval associated with a voltage drop in the energy storage device based at least in part on the count value; and determine the variable resistance of the conductive portion of the resistance-based sensing device based at least in part on the time interval.

BRIEF DESCRIPTION OF THE DRAWINGS

Reference will now be made to the accompanying drawings. The components illustrated in the figures may or may not be present in certain embodiments described herein. Some embodiments may include fewer (or more) components than those shown in the figures in accordance with an example embodiment of the present disclosure.

DETAILED DESCRIPTION

Figure 1:
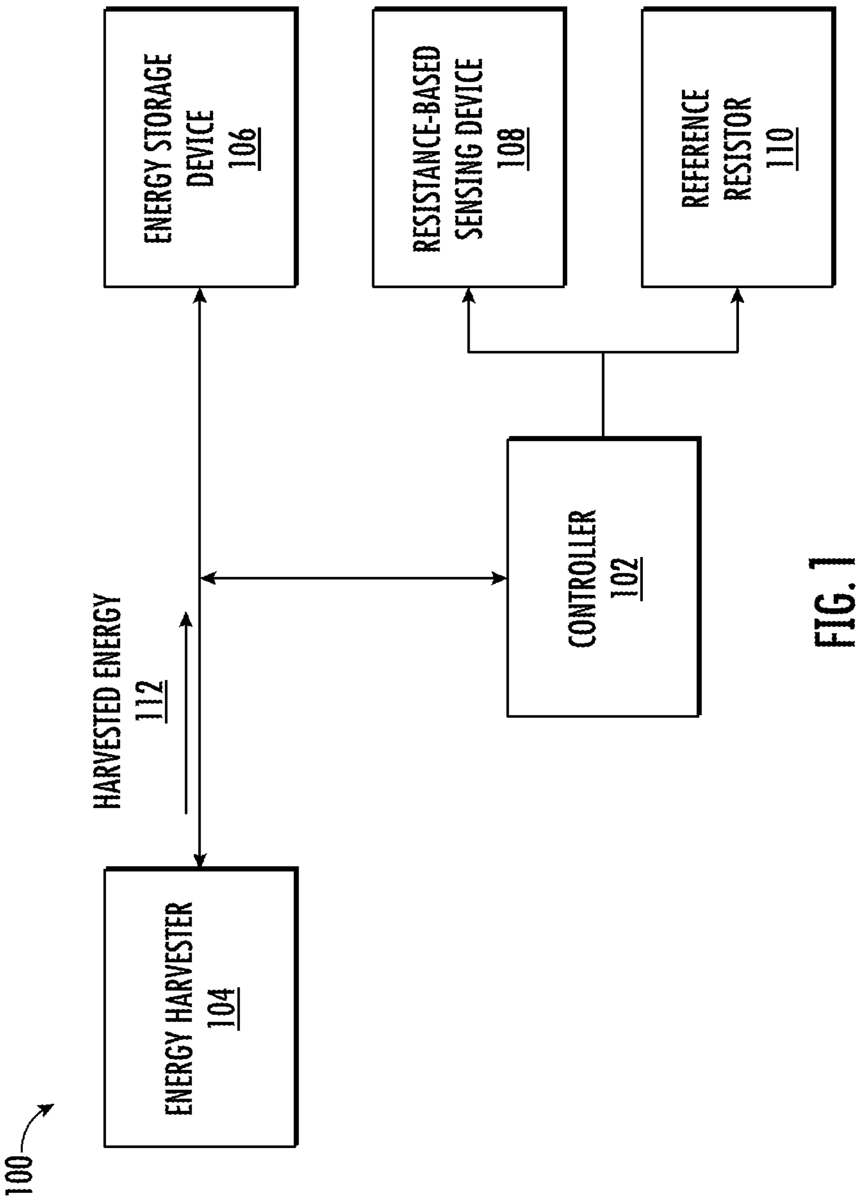
FIG. 1 illustrates an example block diagram of an example low-energy, resistance-based sensing system in accordance with an example embodiment of the present disclosure.

Example embodiments will be described more fully hereinafter with reference to the accompanying drawings, in which some, but not all embodiments of the inventions of the disclosure are shown. Indeed, embodiments of the disclosure may be embodied in many different forms and should not be construed as limited to the embodiments set forth herein; rather, these embodiments are provided so that this disclosure will satisfy applicable legal requirements. Like numbers refer to like elements throughout.

Various example embodiments address technical problems associated with determining a variable resistance of a conductive portion of a resistance-based sensing device in which the resistance of the conductive portion varies based on a physical characteristic of a surrounding environment. As will be appreciated, there are numerous example scenarios in which it may be beneficial to determine a physical characteristic of a surrounding environment based on a variable resistance at a resistance-based sensing device.

In general, resistance-based sensors utilize a change in resistance of a conductive portion of a resistance-based sensing device to determine a physical characteristic of a surrounding environment. For example, due to the piezoresistive effect, the electrical resistance of a conducting material may change when subject to mechanical strain. Utilizing the piezoresistive effect pressure, strain, stress, and other forces exerted on the conductive portion of the resistance-based sensing device from the surrounding environment may be measured and converted into a physical characteristic. In addition, temperature sensors, such as a resistance thermometers, may utilize changes in resistance of a conductive material to determine the temperature in a surrounding environment. Similarly, light sensors may measure a change in resistance at a conductive surface, due to the reception of photons at the surface, to determine the intensity of light in a surrounding environment.

Each of these resistance-based sensors utilizes the measurement of a variable resistance of a conductive portion of a resistance-based sensing device to determine the associated physical characteristic. The resistance of the conductive material may be determined, and the associated physical property may be calculated based on the variable resistance. In some examples, a voltage divider, such as a Wheatstone Bridge configuration is utilized to determine the change in resistance of the measured material. A voltage divider generally requires an excitation voltage and an analog-to-digital converter (ADC) to determine the resistance of the conductive portion of the resistance-based sensing device and the associated physical characteristic. The power to operate the analog-to-digital converter, the excitation voltage, and other components of the resistance-based sensor generally require a significant source of power, such as a battery or power supply.

Many resistance-based sensors utilizing changes in resistance to determine a physical characteristic of a surrounding environment are positioned in inaccessible, remote, or inconvenient environments. Such environments make maintenance on the resistance-based sensor difficult or impossible. In addition, many of these resistance-based sensors are deployed in large numbers for which maintenance of the individual sensors may be untenable. One of the main sources of maintenance is a battery. Batteries may need to be changed periodically for continued operation of the sensor.

Thus, there is a need for periodically measuring the change in resistance of a variable resistor, without a battery and without using an analog-to-digital converter or other power consuming electrical components, and transmitting the change in resistance to a remote computing entity.

The various example embodiments described herein utilize various techniques to determine the variable resistance of a conductive portion of a resistance-based sensing device associated with a physical characteristic of an environment. For example, in some embodiments, a controller may transmit a portion of stored energy through the conductive portion of the resistance-based sensing device and determine the variable resistance of the conductive portion of the resistance-based sensing device based at least in part on the time interval associated with a voltage drop in the energy storage device. Utilizing a power voltage detector and a low power timer, a low-energy, resistance-based sensing system may determine the time interval associated with the voltage drop in the energy storage device using a digital count value, eliminating the need for an ADC. The reduction in required power to determine the variable resistance of the resistance-based sensing device enables a low-energy, resistance-based sensing system to operate with energy from an electrostatic-based energy storage device, such as a capacitor, eliminating the need for a battery.

As a result of the herein described example embodiments and in some examples, the effectiveness of a resistance-based sensor may be greatly improved. For example, a low-energy, resistance-based sensing system may be configured to determine the variable resistance of a conductive portion of a resistance-based sensing device without an ADC and a battery. Eliminating the battery and ADC may significantly reduce the size and area of a low-energy, resistance-based sensing system. Reduction in the size and area of a low-energy, resistance-based sensing system may enable deployment of low-energy, resistance-based sensing systems in various environments requiring low-profile, hidden, uniquely shaped, or other unique deployment environments. For example, smart materials and/or smart bolts may be manufactured and deployed with a low-energy, resistance-based sensing system.

In addition, elimination of various electrical components, including a battery may reduce the maintenance required to maintain a low-energy, resistance-based sensing system, enabling deployment in environments that may be difficult to access. Little or no maintenance may further enable deployment of great numbers of low-energy, resistance-based sensing system without concern for untenable maintenance. Further, a low-energy, resistance-based sensing system in accordance with the present disclosure may increase the life expectancy and stability of the low-energy, resistance-based sensing system. Increased life expectancy and stability further enable deployment in inaccessible environments and in great numbers.

Referring now to FIG. 1, an example low-energy, resistance-based sensing system 100 is provided. As depicted in FIG. 1, the example low-energy, resistance-based sensing system 100 includes an energy harvester 104 electrically coupled to an energy storage device 106 and a controller 102, the energy harvester 104 configured to generate harvested energy 112. As further depicted in FIG. 1, the controller 102 is electrically coupled to a reference resistor 110 and a resistance-based sensing device 108.

As depicted in FIG. 1, the example low-energy, resistance-based sensing system 100 includes an energy harvester 104. An energy harvester 104 is any device configured to collect energy from the surrounding environment and convert the energy into electrical energy (e.g., harvested energy 112). An energy harvester 104 may derive energy from various external sources, such as solar power from the sun, thermal energy from changes in temperature, wind energy, kinetic energy from motion and/or vibration, or any other ambient energy source. In general, the energy harvester 104 converts the ambient energy from the surrounding environment into electrical energy (e.g., harvested energy 112) stored by the energy storage device 106 and/or utilization by the controller 102 or other electrical component of the low-energy, resistance-based sensing system 100.

As further depicted in FIG. 1, the example low-energy, resistance-based sensing system 100 includes an energy storage device 106. An energy storage device 106 is any device configured to accumulate stored energy from the harvested energy 112 generated by the energy harvester 104. For example, the energy storage device 106 may comprise a capacitor, supercapacitor, battery, fuel cell, or other device configured to store electrical energy in another form. In some embodiments, the energy storage device 106 may comprise a passive electrical component, such as a capacitor. A passive electrical component reduces the maintenance and increases the life expectancy of the electrical component. A low-energy, resistance-based sensing system 100 in accordance with the present disclosure may be configured to operate on the power stored in a passive electrical component, such as a capacitor. An embodiment utilizing a capacitor as an energy storage device 106 is further described in relation to FIG. 3.

As further depicted in FIG. 1, the example low-energy, resistance-based sensing system 100 includes a controller 102. A controller 102 is any computing device comprising hardware and/or software configured to utilize the harvested energy 112 stored in the energy storage device 106 to determine the variable resistance of the conductive portion of the resistance-based sensing device 108 based on a time interval associated with a voltage drop in the energy storage device 106. For example, a controller 102 may be configured to monitor the voltage in the energy storage device 106. The controller 102 may periodically measure the voltage in the energy storage device 106 during a harvesting state, as further depicted in FIG. 3. In an instance in which the voltage in the energy storage device 106 reaches a predetermined voltage threshold, the controller 102 may enter an active state in which the controller 102 measures the variable resistance of the resistance-based sensing device 108, calibrates based on a measurement of the reference resistor 110, and/or performs other tasks pertinent to the operation of the low-energy, resistance-based sensing system 100, such as transmits recorded and/or stored data. The controller 102 is discussed further in relation to FIG. 2.

As further depicted in FIG. 1, the example low-energy, resistance-based sensing system 100 includes a resistance-based sensing device 108. A resistance-based sensing device 108 is any device having a conductive portion configured to exhibit a variable electrical resistance (e.g., variable resistance) based on a change in a physical characteristic of the environment surrounding the resistance-based sensing device 108. A physical characteristic is any measurable characteristic of a surface, material, atmosphere, space, or other medium. Physical characteristics may include temperature, pressure, stress, force, strain, light, and so on. The electrical resistance of the conductive portion of the resistance-based sensing device 108 may vary based on changes in physical characteristics.

For example, a conductive portion of a resistance-based sensing device 108 may include a pressure sensing diaphragm formed of a semiconductor material configured to deform under an applied pressure to the surface of the pressure sensing diaphragm. The deflection of the pressure sensing diaphragm creates a variable resistance in the pressure sensing diaphragm corresponding to the pressure applied to the surface. Thus, a measurement of the variable resistance of the pressure sensing diaphragm may be used to determine the pressure in the surrounding environment.

Similarly, a resistance thermometer may utilize a resistance-based sensing device 108 to determine the temperature of an environment or surface. In one example, a conductive portion, such as a platinum wire, may exhibit a variable resistance corresponding to the temperature of the surrounding environment. Thus, a measurement of the variable resistance of the platinum wire may be used to determine the temperature of the surrounding environment.

In another example, the resistance of a material may vary (e.g., variable resistance) based on the stress on a material and/or surface. Stress may be any force present during deformation of a material. For example, stress may include a tensile force, compressive force, shear force, bending force, and/or torsion force. Each of these forces may alter the variable resistance of the material, surface, and/or a conductive portion integrated with the material and/or surface. Thus, a measurement of the variable resistance of the conductive portion of the material and/or surface may be used to determine the stress on the material and/or surface.

As further depicted in FIG. 1, the example low-energy, resistance-based sensing system 100 includes a reference resistor 110. A reference resistor 110 may be any conductive object, item, structure, material, etc. with a known resistance value. For example, a reference resistor 110 may comprise a resistor or variable resistor with a known and/or programmable value. The reference resistor 110 may be used to calibrate the low-energy, resistance-based sensing system 100. For example, before and/or during operation, the stored energy in the energy storage device 106 may be transmitted to the reference resistor 110. The controller 102 may determine a reference time interval representing the time interval associated with a reference voltage drop in the energy storage device 106 in an instance in which current is transmitted from the energy storage device 106 and through the reference resistor 110. The reference time interval may be compared to a measured time interval of the variable resistance of the conductive portion of the resistance-based sensing device 108 to determine a resistance value of the conductive portion of the resistance-based sensing device 108.

In some embodiments, the reference time interval corresponding to a reference voltage drop may be periodically measured during operation. By periodically measuring the reference time interval and re-calibrating based on the resistance value of the reference resistor 110, changes in the environment, such as temperature, humidity, and other environmental changes may be accounted for.

Figure 2:
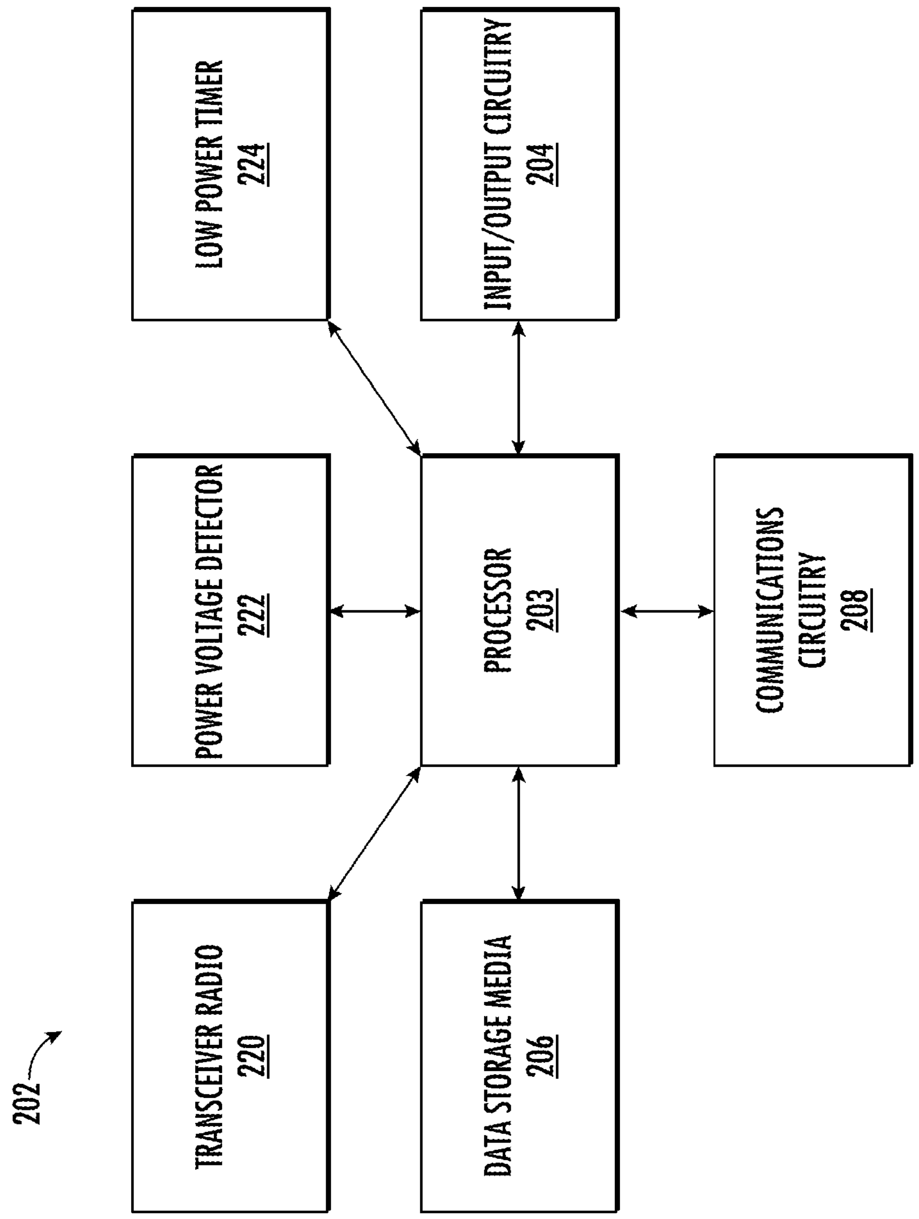
FIG. 2 illustrates an example block diagram of an example controller in a low-energy, resistance-based sensing system in accordance with an example embodiment of the present disclosure.

Referring now to FIG. 2, a block diagram of an example controller 202 is depicted. FIG. 2 illustrates an example controller 202 in accordance with at least some example embodiments of the present disclosure. The controller 202 includes processor 203, input/output circuitry 204, data storage media 206, communications circuitry 208, transceiver radio circuitry 220, power voltage detector circuitry 222, and low power timer circuitry 224. In some embodiments, the controller 202 is configured, using one or more of the sets of circuitry 203, 204, 206, 208, 220, 222, and/or 224, to execute and perform the operations described herein.

Although components are described with respect to functional limitations, it should be understood that the particular implementations necessarily include the use of particular computing hardware. It should also be understood that in some embodiments certain of the components described herein include similar or common hardware. For example, two sets of circuitry may both leverage use of the same processor(s), network interface(s), storage medium(s), and/or the like, to perform their associated functions, such that duplicate hardware is not required for each set of circuitry. The user of the term "circuitry" as used herein with respect to components of the apparatuses described herein should therefore be understood to include particular hardware configured to perform the functions associated with the particular circuitry as described herein.

Particularly, the term "circuitry" should be understood broadly to include hardware and, in some embodiments, software for configuring the hardware. For example, in some embodiments, "circuitry" includes processing circuitry, storage media, network interfaces, input/output devices, and/or the like. Alternatively, or additionally, in some embodiments, other elements of the controller 202 provide or supplement the functionality of other particular sets of circuitry. For example, the processor 203 in some embodiments provides processing functionality to any of the sets of circuitry, the data storage media 206 provides storage functionality to any of the sets of circuitry, the communications circuitry 208 provides network interface functionality to any of the sets of circuitry, and/or the like.

In some embodiments, the processor 203 (and/or co-processor or any other processing circuitry assisting or otherwise associated with the processor) is/are in communication with the data storage media 206 via a bus for passing information among components of the controller 202. In some embodiments, for example, the data storage media 206 is non-transitory and may include, for example, one or more volatile and/or non-volatile memories. In other words, for example, the data storage media 206 in some embodiments includes or embodies an electronic storage device (e.g., a computer readable storage medium). In some embodiments, the data storage media 206 is configured to store information, data, content, applications, instructions, or the like, for enabling the controller 202 to carry out various functions in accordance with example embodiments of the present disclosure.

The processor 203 may be embodied in a number of different ways. For example, in some example embodiments, the processor 203 includes one or more processing devices configured to perform independently. Additionally, or alternatively, in some embodiments, the processor 203 includes one or more processor(s) configured in tandem via a bus to enable independent execution of instructions, pipelining, and/or multithreading. The use of the terms "processor" and "processing circuitry" should be understood to include a single core processor, a multi-core processor, multiple processors internal to the controller 202, and/or one or more remote or "cloud" processor(s) external to the controller 202.

In an example embodiment, the processor 203 is configured to execute instructions stored in the data storage media 206 or otherwise accessible to the processor. Alternatively, or additionally, the processor 203 in some embodiments is configured to execute hard-coded functionality. As such, whether configured by hardware or software methods, or by a combination thereof, the processor 203 represents an entity (e.g., physically embodied in circuitry) capable of performing operations according to an embodiment of the present disclosure while configured accordingly. Alternatively, or additionally, as another example in some example embodiments, when the processor 203 is embodied as an executor of software instructions, the instructions specifically configure the processor 203 to perform the algorithms embodied in the specific operations described herein when such instructions are executed.

In some embodiments, the controller 202 includes input/output circuitry 204 that provides output to the user and, in some embodiments, to receive an indication of a user input. In some embodiments, the input/output circuitry 204 is in communication with the processor 203 to provide such functionality. The input/output circuitry 204 may comprise one or more user interface(s) (e.g., user interface) and in some embodiments includes a display that comprises the interface(s) rendered as a web user interface, an application user interface, a user device, a backend system, or the like.

The processor 203 and/or input/output circuitry 204 comprising the processor may be configured to control one or more functions of one or more user interface elements through computer program instructions (e.g., software and/or firmware) stored on a memory accessible to the processor (e.g., data storage media 206, and/or the like). In some embodiments, the input/output circuitry 204 includes or utilizes a user-facing application to provide input/output functionality to a client device and/or other display associated with a user.

In some embodiments, the controller 202 includes communications circuitry 208. The communications circuitry 208 includes any means such as a device or circuitry embodied in either hardware or a combination of hardware and software that is configured to receive and/or transmit data from/to a network and/or any other device, circuitry, or module in communication with the controller 202. In this regard, the communications circuitry 208 includes, for example in some embodiments, a network interface for enabling communications with a wired or wireless communications network. Additionally, or alternatively in some embodiments, the communications circuitry 208 includes one or more network interface card(s), antenna(s), bus(es), switch(es), router(s), modem(s), and supporting hardware, firmware, and/or software, or any other device suitable for enabling communications via one or more communications network(s). Additionally, or alternatively, the communications circuitry 208 includes circuitry for interacting with the antenna(s) and/or other hardware or software to cause transmission of signals via the antenna(s) or to handle receipt of signals received via the antenna(s). In some embodiments, the communications circuitry 208 enables transmission to and/or receipt of data from a client device in communication with the controller 202.

The transceiver radio circuitry 220 includes hardware, software, firmware, and/or a combination thereof, that supports various functionality associated with sending and receiving messages in accordance with a wireless communication protocol. For example, the transceiver radio circuitry 220 may be configured to support transmission and receipt of messages in accordance with Bluetooth, Bluetooth Low Energy (LE), ZigBee, LTE, 5G, Wi-Fi, or another wireless communication protocol. In some embodiments, the transceiver radio circuitry 220 may be configured to periodically transmit data associated with the variable resistance of the resistance-based sensing device (e.g., resistance-based sensing device 108 depicted in FIG. 1). For example, the determined variable resistance, measured time intervals, configured voltage drops, reference time intervals, configured reference voltage drops, clock counts associated with the time interval and reference time interval, clock frequency of the processor 203, and so on. In some embodiments, a receiving device may be configured to determine the time interval, and/or variable resistance based on the transmitted data.

In addition, the transceiver radio circuitry 220 may be configured to receive messages in accordance with the wireless communication protocol. For example, a remote computing device may transmit configuration data, including the frequency with which the variable resistance is measured and/or the frequency with which the determined variable resistance is transmitted.

The power voltage detector circuitry 222 includes hardware, software, firmware, and/or a combination thereof, that supports various functionality associated with measuring the voltage value in an electrically connected electrical component, such as an energy storage device (e.g., energy storage device 106 depicted in FIG. 1). The power voltage detector circuitry 222 may be utilized to trigger the transition between the harvesting state and the active state of the low-energy, resistance-based sensing system based on the voltage value of the energy storage device. For example, a maximum voltage (e.g., first voltage value) may be configured. In some embodiments, the maximum voltage may be associated with a maximum voltage capacity of the energy storage device. In an instance in which the voltage value of the energy storage device meets or exceeds the maximum voltage, the low-energy, resistance-based sensing system may transition from a harvesting state to an active state. During the active state, the low-energy, resistance-based sensing system may utilize the stored energy in the energy storage device to perform tasks, such as measure the variable resistance of the resistance-based sensing device, measure the reference time interval associated with the reference resistor, transmit data through the transceiver radio circuitry 220, and so on. The active state is described further in relation to FIG. 4.

The low-energy, resistance-based sensing system may also be configured with a minimum voltage (e.g., second voltage value). The minimum voltage may be associated with the minimum voltage required to operate the low-energy, resistance-based sensing system. In an instance in which the minimum voltage is detected, the low-energy, resistance-based sensing system may transition into an energy harvesting state, in which harvested energy is directed toward the energy storage device. The energy harvesting state is described further in relation to FIG. 3.

The low power timer circuitry 224 includes hardware, software, firmware, and/or a combination thereof, that supports various functionality associated with incrementing a count value. The count value may be configured to increment relative to the clock frequency of the processor 203. The count value of the low power timer circuitry 224 may be utilized to determine transmission intervals, determine measurement intervals of the voltage value on the energy storage device, and so on. In addition, the count value may be used to measure the time interval of the voltage drop in the energy storage device for purposes of determining the reference time interval and the variable resistance of the conductive component on the resistance-based sensing device. For example, the count value associated with the voltage drop in the energy storage device from the maximum voltage to the minimum voltage may be determined in an instance in which the harvested energy stored in the energy storage device is transmitted to the resistance-based sensing device. The count value may be used to determine the variable resistance of the resistance-based sensing device. The determination of the variable resistance based on the count value is described further in relation to FIG. 6-FIG. 7.

Additionally, or alternatively, in some embodiments, one or more of the sets of circuitry 203-224 are combinable. Additionally, or alternatively, in some embodiments, one or more of the sets of circuitry perform some or all of the functionality described associated with another component. For example, in some embodiments, one or more sets of circuitry 203-224 are combined into a single module embodied in hardware, software, firmware, and/or a combination thereof. Similarly, in some embodiments, one or more of the sets of circuitry, for example transceiver radio circuitry 220, power voltage detector circuitry 222, and/or low power timer circuitry 224, is/are combined such that the processor 203 performs one or more of the operations described above with respect to each of these circuitries individually.

Figure 3:
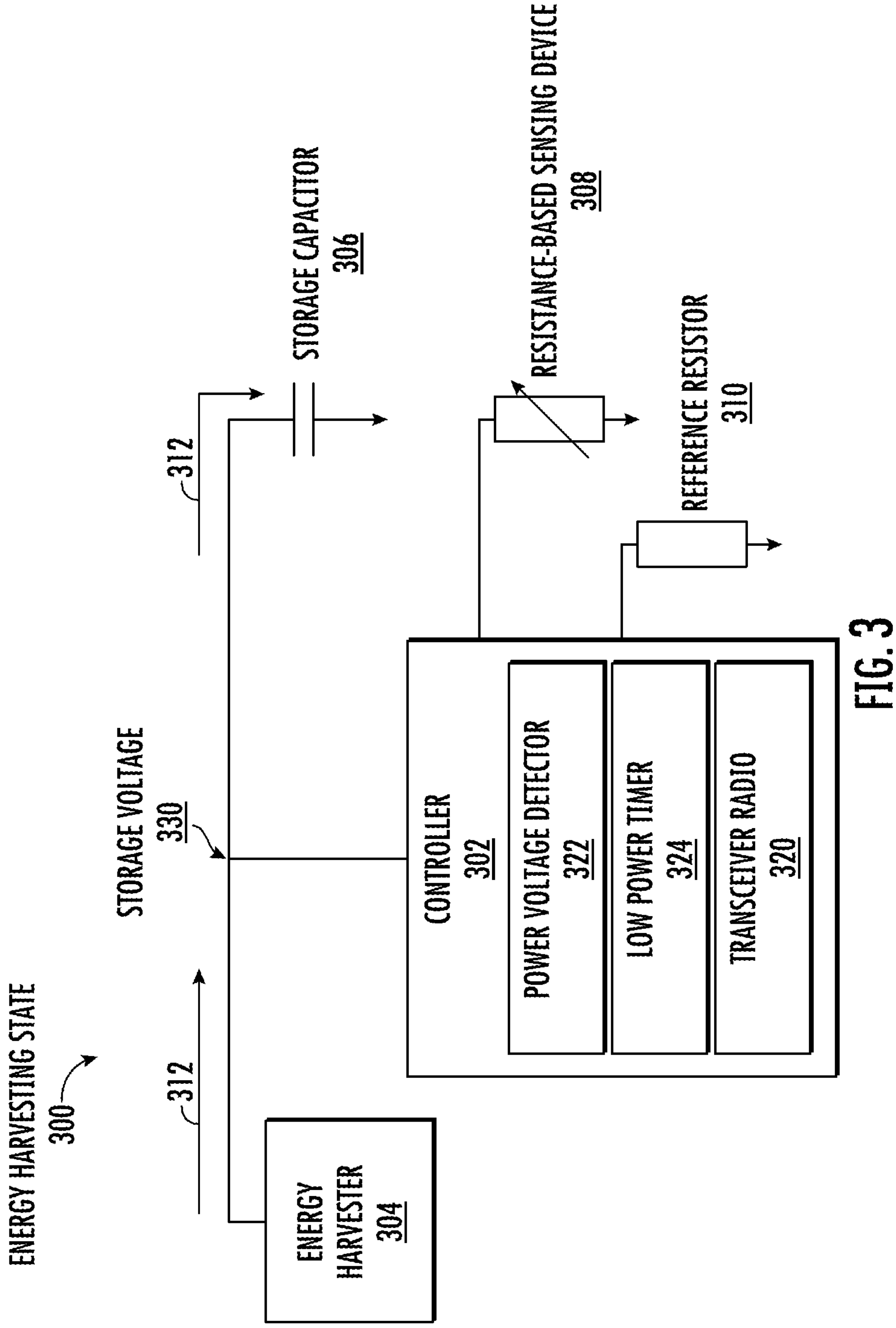
FIG. 3 illustrates a harvesting state of an example embodiment of a low-energy, resistance-based sensing system in accordance with an example embodiment of the present disclosure.

Referring now to FIG. 3, an example low-energy, resistance-based sensing system 300 in an energy harvesting state is provided. As depicted in FIG. 3, the example low-energy, resistance-based sensing system 300 includes an energy harvester 304 electrically coupled to an energy storage device (e.g., storage capacitor 306) and a controller 302, the energy harvester 304 configured to generate harvested energy 312. As further depicted in FIG. 3, the controller 302 is electrically coupled to a reference resistor 310 and a resistance-based sensing device 308. The depicted controller 302 comprises power voltage detector circuitry 322, low power timer circuitry 324, and transceiver radio circuitry 320.

In the depicted harvesting state of FIG. 3, the harvested energy 312 is transmitted to the storage capacitor 306. The storage capacitor 306 is one or more passive electrical components configured to store electrical energy in an electrical field by accumulating electric charge on two closes space conductive surfaces separated by a dielectric medium. As depicted in FIG. 3, the accumulated electric charge creates a storage voltage 330. The storage voltage 330 represents the difference in electric potential between the two plates of the storage capacitor 306.

During the harvesting state, the controller 302 remains in a sleep state, utilizing a minimal amount of power. For example, the controller 302 may utilize a low power timer circuitry 324 to determine the frequency at which the storage voltage 330 may be measured by the power voltage detector circuitry 322. The low power timer circuitry 324 may be configured to utilize negligible power, on the order of picowatts. The power voltage detector circuitry 322 may periodically measure the storage voltage 330 to determine if the maximum voltage signaling the transition from the harvesting state to the active state has been reached. Due to the minimized controller 302 activity, during the sleep state the controller 302 may utilize power on the order of microwatts. As such, the harvested energy 312 is primarily utilized to build up the storage voltage 330 by charging the storage capacitor 306.

In an instance in which the storage voltage 330 reaches a maximum voltage, the low-energy, resistance-based sensing system 300 may transition into an active state. A maximum voltage is any voltage at which the controller 302 is configured to transition into an active state. For example, the maximum voltage may be the storage capacity of the storage capacitor 306. Or, the maximum voltage may be the voltage required to perform a particular function, for example, measure the variable resistance of the resistance-based sensing device 308, measure the resistance of the reference resistor 310, and/or perform a controller 302 function, such as transmit data utilizing the transceiver radio circuitry 320.

Figure 4:
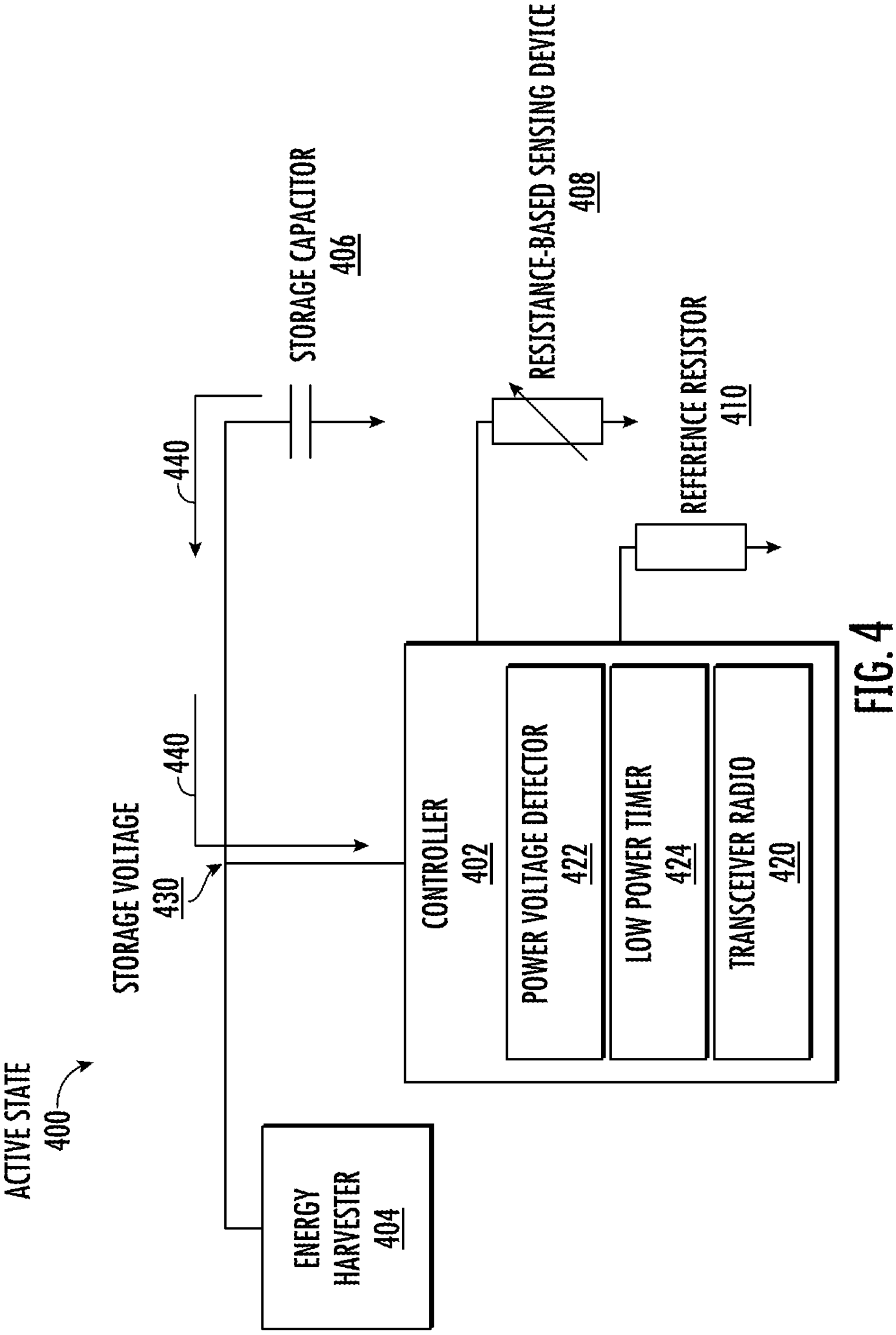
FIG. 4 illustrates an active state of an example embodiment of a low-energy, resistance-based sensing system in accordance with an example embodiment of the present disclosure.

Referring now to FIG. 4, an example low-energy, resistance-based sensing system 400 in an active state is provided. As depicted in FIG. 4, the example low-energy, resistance-based sensing system 400 includes an energy harvester 404 electrically coupled to an energy storage device (e.g., storage capacitor 406) and a controller 402, the controller 402 configured to receive stored energy 440 from the storage capacitor 406. As further depicted in FIG. 4, the controller 402 is electrically coupled to a reference resistor 410 and a resistance-based sensing device 408. The depicted controller 402 comprises power voltage detector circuitry 422, low power timer circuitry 424, and transceiver radio circuitry 420.

In the depicted active state of FIG. 4, the storage voltage 430 has reached a maximum voltage and the stored energy 440 is transmitted from the storage capacitor 406 to the controller 402. During the active state, the controller 402 utilizes the power voltage detector circuitry 422 to monitor the storage voltage 430 representing the stored energy in the storage capacitor 406. In an instance in which the minimum voltage is reached, the controller transitions back into an energy harvesting state as depicted in FIG. 3, and the harvested energy is transmitted to the storage capacitor 406. The minimum voltage is any voltage at which the controller 402 is configured to transition into an energy harvesting state. For example, the minimum voltage may be the minimum operating voltage of the controller 402.

The controller 402 may perform a number of functions during the active state. For example, the controller 402 may transmit the stored energy 440 to the reference resistor 410 and perform a calibrating measurement to determine a reference time interval based on the resistance value of the reference resistor 410. In another example, the controller 402 may transmit the stored energy 440 to the resistance-based sensing device 408 and determine the variable resistance of the resistance-based sensing device 408 by determining a time interval associated with a voltage drop from the maximum voltage to the minimum voltage and determining a variable resistance based on the reference time interval. In another example, the controller 402 may transmit one or more data values representing observed variable resistance values using the transceiver radio circuitry 420.

In some embodiments, the controller 402 may be configured to perform multiple operations during a single active state. In some embodiments, the controller 402 may alternate functions performed from one active state to the next. In an instance in which the storage voltage 430 measured by the power voltage detector circuitry 422 reaches the minimum voltage, the controller 402 transitions back into an energy harvesting state as depicted in FIG. 3.

Figure 5:
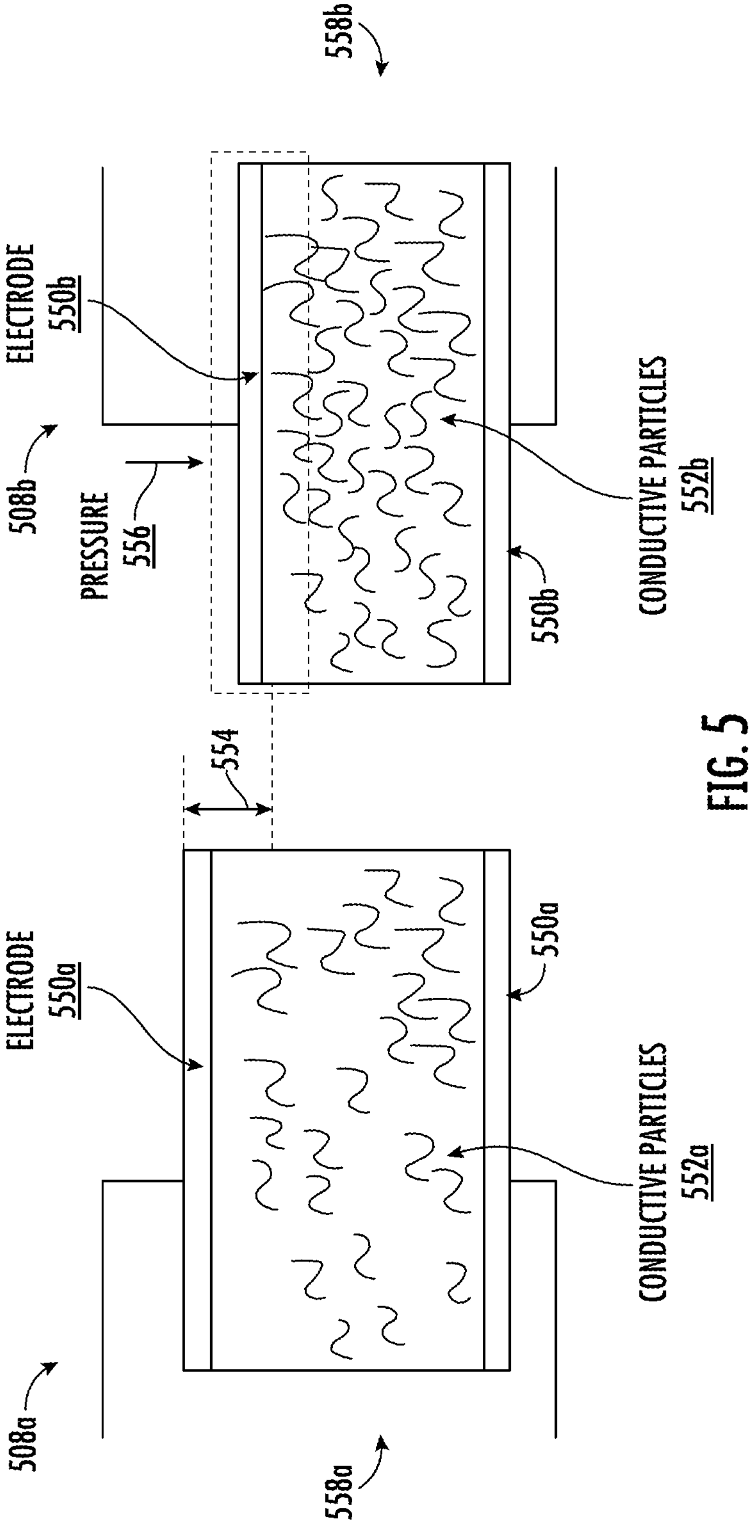
FIG. 5 illustrates an example resistance-based sensing device configured to measure a pressure in accordance with an example embodiment of the present disclosure.

Referring now to FIG. 5, an example resistance-based sensing device 508*a*, 508*b* is provided. The resistance-based sensing device 508*a*, 508*b* depicts one, non-limiting example of how a physical characteristic (e.g., pressure 556) of an external environment may change the resistance value of a conductive portion 558*a*, 558*b* of a resistance-based sensing device 508*a*, 508*b*.

As depicted in FIG. 5, the resistance-based sensing device 508*a*, 508*b* includes a conductive portion 558*a*, 558*b* having conductive particles 552*a*, 552*b*. The density of the conductive particles 552*a*, 552*b* determine the conductivity of the conductive portion 558*a*, 558*b*. The higher the density of conductive particles 552*a*, 552*b* the higher the conductivity of the conductive portion 558*a*, 558*b*. Conversely, the higher the density of conductive particles 552*a*, 552*b* the lower the resistance value of the conductive portion 558*a*, 558*b*. Thus, the pressure 556 of the surrounding environment may be measured based on the change in resistance of the conductive portion 558*a*, 558*b* of the resistance-based sensing device 508*a*, 508*b*.

For example, as depicted in FIG. 5, in an instance in which a pressure 556 is applied to a surface of a resistance-based sensing device 508*b*, the surface of the resistance-based sensing device 508*b* is displaced by a distance 554. The displacement of the surface of the resistance-based sensing device 508*b* increases the density of conductive particles 552*b* in the resistance-based sensing device 508*b* and reduces the resistance value of the conductive portion 558*b* of the resistance-based sensing device 508*b*.

As further depicted in FIG. 5, the conductive portion 558*a*, 558*b* of the resistance-based sensing device 508*a*, 508*b* includes a pair of electrodes 550*a*, 550*b*. The pair of electrodes 550*a*, 550*b* enable the transmission of a current through the conductive portion 558*a*, 558*b* of the resistance-based sensing device 508*a*, 508*b*. Measuring the time interval associated with a voltage drop in an energy storage device as a current is transmitted through the conductive portion 558*a*, 558*b* of the resistance-based sensing device 508*a*, 508*b* may enable a determination of the resistance value associated with the conductive portion 558*a*, 558*b* and thus the physical characteristic (e.g., pressure 556) of the external environment.

FIG. 5 depicts one non-limiting example of how a physical characteristic of an external environment may change the resistance value of a conductive portion of a resistance-based sensing device. However, there are many ways in which a physical characteristic of an external environment may change the resistance value of a conductive portion of a resistance-based sensing device. For example, temperature, tensile force, shear force, bending force, and/or torsion force may all affect the conductive particle density of a conductive portion of a resistance-based sensing device.

Figure 6:
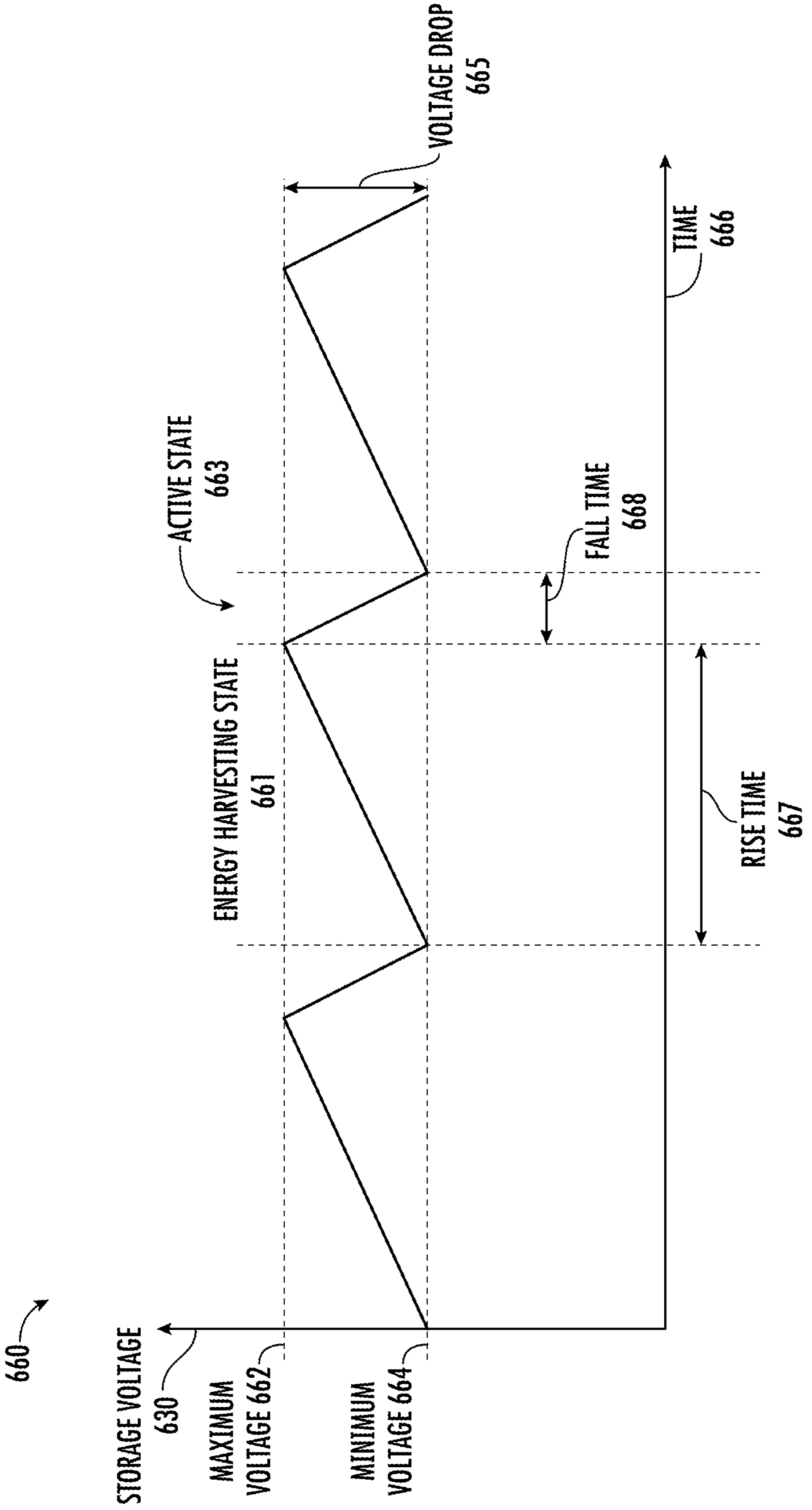
FIG. 6 illustrates an example graph of an example rise time and fall time of a storage voltage of a low-energy, resistance-based sensing system in accordance with an example embodiment of the present disclosure.

Referring now to FIG. 6, an example graph 660 depicting the storage voltage 630 in an energy storage device (e.g., energy storage device 106, storage capacitor 306, 406) with respect to time 666 during an energy harvesting state 661 and an active state 663 is depicted.

As depicted in FIG. 6, during the energy harvesting state 661, the controller (e.g., controller 102, 202, 302, 402) of the low-energy, resistance-based sensing system enters a sleep state. During the sleep state, a low power timer (e.g., low power timer circuitry 224, 324, 424) and a power voltage detector (e.g., power voltage detector circuitry 222, 322, 422) are the primary sources of energy consumption. Thus, power consumption during the energy harvesting state 661 is low, allowing the storage voltage 630 in the energy storage device to build. For example, as depicted in FIG. 6, at the beginning of the energy harvesting state 661, the storage voltage 630 is at or near the minimum voltage 664. However, at the end of the energy harvesting state 661, the storage voltage is at or near the maximum voltage 662. The time interval associated with the increase in storage voltage 630 from the minimum voltage 664 to the maximum voltage 662 is the rise time 667. The more energy harvested by the energy harvester (e.g., energy harvester 104, 304, 404), the faster the rise time 667. Similarly, the less power used by the low-energy, resistance-based sensing system, the faster the rise time 667.

As further depicted in FIG. 6, during the active state 663, the storage voltage 630 experiences a voltage drop 665 from the maximum voltage 662 to the minimum voltage 664. The voltage drop 665 depicted in FIG. 6 is the drop in voltage of the energy storage device due to the dissipation of energy primarily through the resistance-based sensing device (e.g., resistance-based sensing device 108, 308, 408, 508). The fall time 668 depicted in FIG. 6 is the time interval associated with the voltage drop 665 during the active state 663.

The fall time 668 may vary based on the resistance value (e.g., variable resistance $R_{var}$) of the conductive portion of the resistance-based sensing device. The fall time 668 may be determined based on the output of the low power timer and the power voltage detector. For example, during the active state of the controller, the low power timer may continually update a count value ($count_{ipt}$) according to a counter frequency ($f_{counter}$), relative to the clock frequency of the controller. In some embodiments, the count value may increment every clock cycle, every other clock, or some other regular interval based on the clock of the low power timer. During operation, the count value may be reinitialized (e.g., set to zero) at the start of the active state 663. The count value may update according to the counter frequency for the duration of the active state 663. In an instance in which the storage voltage 630 is less than or equal to the minimum voltage 664, the controller may transition into an energy harvesting state 661 and the count value stopped. The fall time 668 ($t_{fall}$) may be determined based on the count value ($count_{ipt}$) of the low power timer and the counter frequency ($f_{counter}$) with which the counter is incremented. For example, according to the following equation:

$$t_{fall} = \frac{count_{ipt}}{f_{counter}}$$

As described herein, the fall time 668 associated with the voltage drop 665 may vary based on the resistance value of the conductive portion of the resistance-based sensing device. Thus, the fall time 668 may be used to determine the variable resistance ($R_{var}$) of the conductive portion of the resistance-based sensing device. For example, the power dissipated ($P_R$) through the conductive portion of the resistance-based sensing device having a variable resistance may be determined by the following equation:

$$P_R = \frac{E_{available}}{t_{fall}}$$

where $P_R$ is the power dissipated, $E_{available}$ is the energy available from the energy storage device and $t_{fall}$ is the fall time 668. In an embodiment in which the maximum voltage 662 ($V_H$) and the minimum voltage 664 ($V_L$) are constant, the energy available from the energy storage device ($E_{available}$) is also constant. For example, in an instance in which the energy storage device is a capacitor, the energy available from the storage device may be determined by the equation:

$$E_{available} = \frac{C_{storage} \cdot (V_H^2 - V_L^2)}{2}$$

where $C_{storage}$ is the capacitance of the capacitor used as a storage device. Thus, in an instance in which the available energy is dissipated through the conductive portion of the resistance-based sensing device, the power dissipated through the conductive portion of the resistance-based sensing device may be determined by the equation:

$$P_R = \frac{E_{available}}{t_{fall}} = \frac{C_{storage} \cdot (V_H^2 - V_L^2)}{2 \cdot t_{fall}}$$

In addition, the power dissipated ($P_R$) through the conductive portion of the resistance-based sensing device is related to the variable resistance ($R_{var}$) of the conductive portion of the resistance-based sensing device by the equation:

$$P_R = I \cdot V$$

where V is the average voltage dissipated through the conductive portion of the resistance-based sensing device and defined by the equation:

$$V = \frac{V_H + V_L}{2}$$

and I is the average current through the resistance-based sensing device and defined by the equation:

$$I = \frac{V}{R} = \frac{V_H + V_L}{2 \cdot R_{var}}$$

Thus, the power dissipated ($P_R$) through the conductive portion of the resistance-based sensing device is:

$$P_R = \frac{(V_H + V_L)^2}{4 \cdot R_{var}} = \frac{C_{storage} \cdot (V_H^2 - V_L^2)}{2 \cdot t_{fall}}$$

$$R_{var} = \frac{(V_H + V_L)^2}{2 \cdot C_{storage} \cdot (V_H^2 - V_L^2)} \cdot t_{fall} = \frac{V_H + V_L}{2 \cdot C_{storage} \cdot (V_H - V_L)} \cdot t_{fall}$$

As shown by the equations above, the variable resistance ($R_{var}$) of the conductive portion of the resistance-based sensing device, and the corresponding physical characteristic of the surrounding environment, may be determined based on the fall time 668 determined by the low power timer monitoring the storage voltage 630 of the energy storage device using a power voltage detector. Determination of the variable resistance of the conductive portion of the resistance-based sensing device according to the process described herein is performed primarily based on the count value returned by the low power timer. The count value is a digital value representable by discrete values. Thus, no analog measurements of the variable resistance of the conductive portion of the resistance-based sensing device are required in the determination of the count value and the variable resistance. Conversely, in previous examples a voltage divider, Wheatstone Bridge, or other analog component is utilized to determine the variable resistance of the conductive portion of the resistance-based sensing device, requiring conversion from an analog value to a digital value in the process.

Determination of the variable resistance of the conductive portion of the resistance-based sensing device based on the digital count value and interval time may eliminate the need for an analog-to-digital converter and other power consuming electrical components. Thus, the low-energy, resistance-based sensing system may operate on small amounts of energy harvested by an energy harvester and stored in an energy storage device, such as a capacitor, eliminating the need for a battery. Eliminating the battery and ADC in a low-energy, resistance-based sensing system may significantly reduce the size and area of the low-energy, resistance-based sensing system and increase the stability and life expectancy of the low-energy, resistance-based sensing system. Reducing the size of the low-energy, resistance-based sensing system and increasing the stability may enable deployment of the low-energy, resistance-based sensing system in great numbers and in areas that may be difficult to access.

Figure 7:
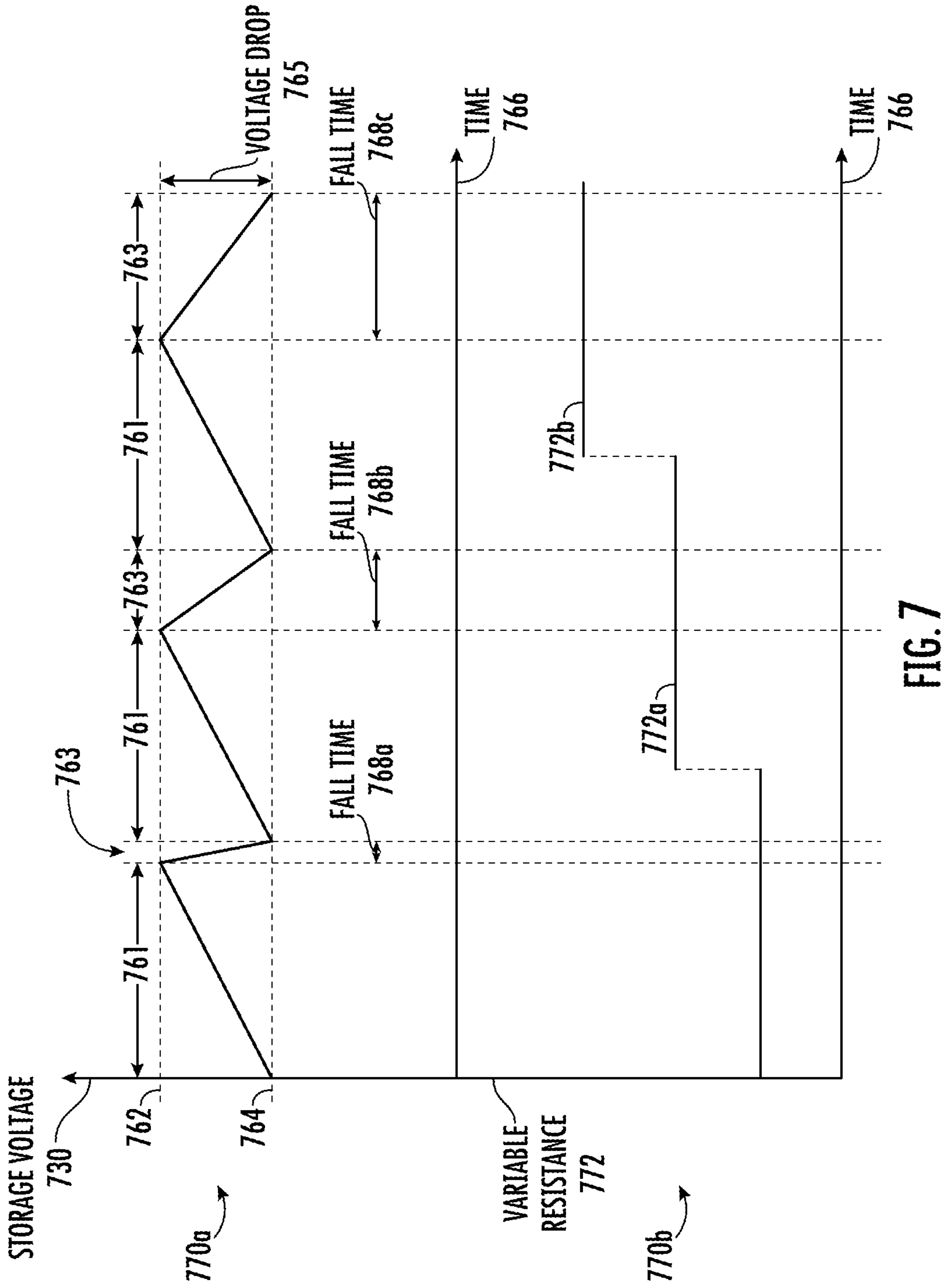
FIG. 7 illustrates an example graph of a plurality of example fall times varying based on a variable resistance in accordance with an example embodiment of the present disclosure.

Referring now to FIG. 7, an example graph 770*a* depicting the storage voltage 730 in an energy storage device (e.g., energy storage device 106, storage capacitor 306, 406) with respect to time 766 during a plurality of energy harvesting states 761 and active states 763 is depicted. In addition, an example graph 770*b* depicting a determined variable resistance 772$_a$-772*b* based on the fall time 768$_a$-768*c* of the storage voltage 730 is depicted.

As depicted in FIG. 7, the example low-energy, resistance-based sensing system (e.g., low-energy, resistance-based sensing system 100, 300, 400) continuously transitions between an energy harvesting state 761 and an active state 763. In an energy harvesting state 761, a controller (e.g., controller 102, 202, 302, 402) reduces power consumption, for example, by disabling power consuming electronic components. In some embodiments, the low-energy, resistance-based sensing system may enable a low power timer (e.g., low power timer circuitry 224, 324, 424) and a power voltage detector (e.g., power voltage detector circuitry 222, 322, 422) to monitor the voltage during the energy harvesting states 761. In an instance in which the storage voltage 730 meets or exceeds the pre-determined maximum voltage 762, the low-energy, resistance-based sensing system transitions into an active state 763. Similarly, in an instance in which the storage voltage 730 is equivalent to or below the pre-determined minimum voltage 764, the low-energy, resistance-based sensing system transitions into the energy harvesting state 761.

A low-energy, resistance-based sensing system may perform one or more operations during an active state 763. For example, a low-energy, resistance-based sensing system may utilize the available energy in the energy storage device to transmit data. In addition, the low-energy, resistance-based sensing system may utilize the available energy to recalibrate, for example, by transmitting stored energy from the energy storage device to a reference resistor (e.g., reference resistor 110, 310, 410). The low-energy, resistance-based sensing system may use the reference time interval corresponding to a reference voltage drop in the reference resistor to calibrate or recalibrate any model used to determine the variable resistance 772 based on a time interval. A low-energy, resistance-based sensing system may also utilize the available energy to measure the variable resistance 772 of a conductive portion of a resistance-based sensing device. As described herein, the low-energy, resistance-based sensing system may determine the variable resistance 772 based at least in part on the time interval (e.g., fall time 768*a*, 768*b*, 768*c*) associated with a voltage drop 765 during an active state 763 in which the stored energy of the energy storage device is transmitted through the resistance-based sensing device. In some embodiments, the low-energy, resistance-based sensing system may alternate which tasks are performed during the active state 763. For example, the low-energy, resistance-based sensing system may alternate between measuring the variable resistance 772 of the resistance-based sensing device and transmitting the data related to the variable resistance 772 using the transceiver radio circuitry (e.g., transceiver radio circuitry 220, 320, 420). In some embodiments, the low-energy, resistance-based sensing system may perform multiple tasks during the active state 763. For example, measure the variable resistance 772 of the resistance-based sensing device and transmit the data during the same active state 763.

As further depicted in FIG. 7, the determined variable resistance 772 of the resistance-based sensing device may vary proportionally based on the fall time 768*a*-768*c*. For example, the variable resistance 772 of a resistance-based sensing device having a shorter fall time 768 may be less than the variable resistance 772 of a resistance-based sensing device having a longer fall time 768. As depicted in FIG. 7, the measured fall time 768*a* may correspond to a variable resistance 772*a*. However, a subsequent measured fall time

768*b* may be longer than the fall time 768*a*, thus corresponding to a greater variable resistance 772*b*. The determination of the variable resistance of a resistance-based sensing device is described further in relation to FIG. 6.

Figure 8:
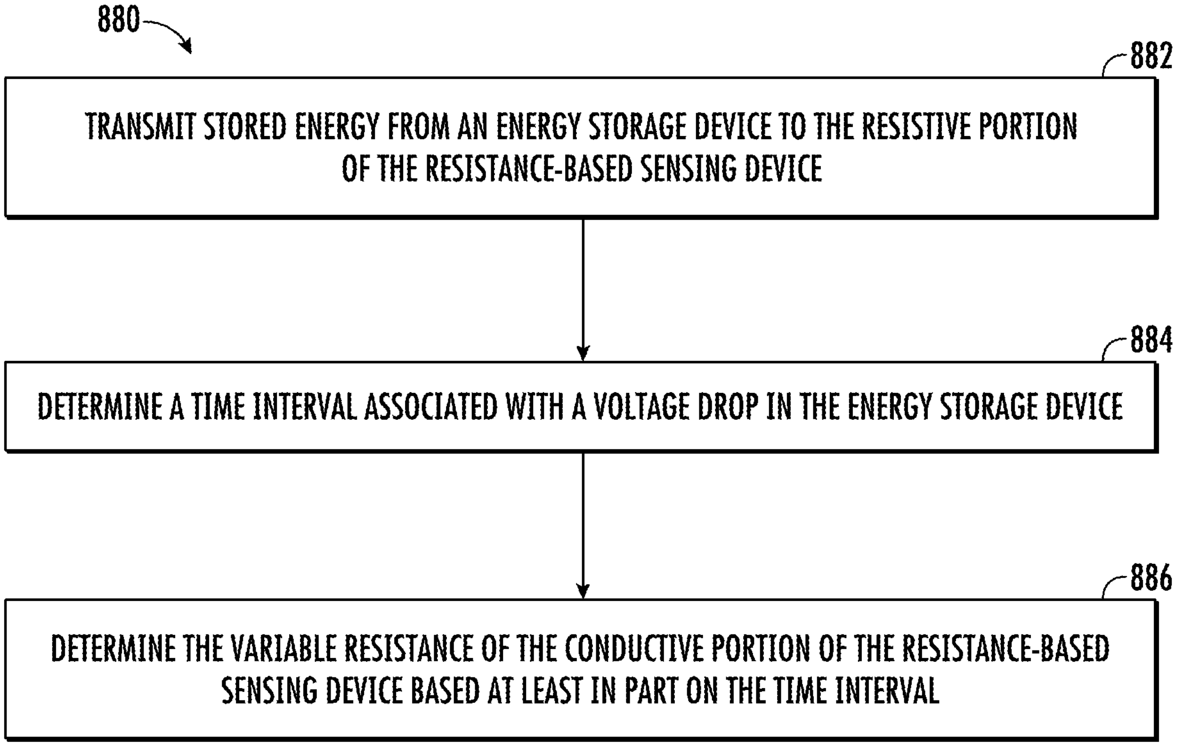
FIG. 8 illustrates an example flow chart for determining a variable resistance of a conductive portion of a resistance-based sensing device in accordance with an example embodiment of the present disclosure.

Referring now to FIG. 8, an example process 880 for determining a variable resistance (e.g., variable resistance 772) of a conductive portion of a resistance-based sensing device (e.g., resistance-based sensing device 108, 308, 408, 508) is provided. At block 882, the controller (e.g., controller 102, 202, 302, 402) transmits stored energy from an energy storage device (e.g., energy storage device 106, storage capacitor 306, 406) to the conductive portion of the resistance-based sensing device. The controller is configured to direct the stored energy of the energy storage device to the resistance-based sensing device. For example, the controller may be electrically connected to the energy storage device and the resistance-based sensing device such that the controller may provide a selectively enabled conductive path directly between the energy storage device and the resistance-based sensing device. In some embodiments, the controller may access a switch providing a selectively enabled conductive path between the energy storage device and the resistance-based sensing device. In such an embodiment, the controller may activate the switch during the active state and deactivate the switch during the energy harvesting state.

At block 884, the controller determines a time interval associated with a voltage drop in the energy storage device. In an instance in which a pre-determined maximum voltage (e.g., maximum voltage 662, 762) is measured by the controller, the low-energy, resistance-based sensing system enters into an active state. Further, in an instance in which the controller creates a conductive path between the energy storage device and the resistance-based sensing device, the storage voltage (e.g., storage voltage 330, 430, 630, 730) associated with the energy storage device begins to fall. The controller may initiate a low power timer (e.g., low power timer circuitry 224, 324, 424) to generate a count value based on a clock frequency of the controller. The controller may further utilize a power voltage detector (e.g., power voltage detector circuitry 222, 322, 422) to monitor the storage voltage at the energy storage device during the active state. In an instance in which the storage voltage is equal to or below a pre-determined minimum voltage (e.g., minimum voltage 664, 764) the count value of the low power timer may be recorded and the low-energy, resistance-based sensing system transitioned back into an energy harvesting state. The recorded count value may be utilized to determine a time interval associated with the voltage drop from the maximum voltage to the minimum voltage. The time interval may be determined based on the count value, the clock frequency of the controller, and/or the count frequency of the low power timer.

At block 886, the controller determines the variable resistance of the conductive portion of the resistance-based sensing device based at least in part on the time interval. As described in relation to FIG. 6, the variable resistance of the conductive portion of the resistance-based sensing element may be determined based on the time interval associated with the voltage drop at the energy storage device. Leveraging a low power timer to determine a count value associated with the voltage drop enables a digital measurement of the variable resistance of the conductive portion of the resistance-based sensing device to be determined without utilizing a power consuming analog-to-digital converter. The resistance of the conductive portion of the resistance-based sensing device further relates to a physical characteristic of the surrounding environment. Thus, measurements of certain physical characteristics of the surrounding environment may be made with a low-energy, resistance-based sensing system having no battery. Such improvements enable deployment of a low-energy, resistance-based sensing system in an inaccessible location. In addition, little or no requirement for maintenance enables deployment of large numbers of a low-energy, resistance-based sensing system without inhibitive maintenance requirements.

While this detailed description has set forth some embodiments of the present invention, the appended claims cover other embodiments of the present invention which differ from the described embodiments according to various modifications and improvements. For example, one skilled in the art may recognize that such principles may be applied to any apparatus utilizing a resistance-based sensing device to determine a physical characteristic of an environment. For example, a plurality of smart bolts, nuts, and/or washers deployed on a bridge, a tall building, the hull of a ship, a roller coaster, or other difficult to access location. Utilizing a low-energy, resistance-based sensing system in accordance with the present disclosure may enable monitoring of each individual smart bolt/nut/washer with limited to no maintenance over an extended period of time. A change in pressure measured by a resistance-based sensing device may be detected, perhaps indicating a loose bolt. The failing device may be addressed before a catastrophic failure occurs.

Within the appended claims, unless the specific term “means for” or “step for” is used within a given claim, it is not intended that the claim be interpreted under 35 U.S.C. 112, paragraph 6.

Use of broader terms such as “comprises,” “includes,” and “having” should be understood to provide support for narrower terms such as “consisting of,” “consisting essentially of,” and “comprised substantially of” Use of the terms “optionally,” “may,” “might,” “possibly,” and the like with respect to any element of an embodiment means that the element is not required, or alternatively, the element is required, both alternatives being within the scope of the embodiment(s). Also, references to examples are merely provided for illustrative purposes, and are not intended to be exclusive.

The invention claimed is:

1. An apparatus comprising:

a resistance-based sensing device comprising a conductive portion configured to indicate a physical characteristic of an environment based on a variable resistance of the conductive portion; and a controller electrically coupled to the resistance-based sensing device, comprising one or more processors and one or more storage devices storing instructions that are operable, when executed by the one or more processors, to cause the one or more processors to:

transmit stored energy from an energy storage device to the conductive portion of the resistance-based sensing device;

determine a time interval associated with a voltage drop in the energy storage device from a first voltage value to a second voltage value; and determine the variable resistance of the conductive portion of the resistance-based sensing device based at least in part on the time interval associated with the voltage drop in the energy storage device.

2. The apparatus of claim 1, further comprising an energy harvester configured to generate harvested energy and transmit the harvested energy to the energy storage device.

3. The apparatus of claim 2, wherein the energy harvester generates the harvested energy from a natural power source.

4. The apparatus of claim 3, wherein the natural power source is at least one of solar power, thermal energy, wind energy, and vibration energy.

5. The apparatus of claim 1, wherein the physical characteristic of the environment indicated by the resistance-based sensing device is at least one of pressure, stress, temperature, and light.

6. The apparatus of claim 1, further comprising a low power timer electrically coupled to the controller and configured to generate a count value based on a clock frequency of the controller.

7. The apparatus of claim 6, wherein the time interval associated with the voltage drop in the energy storage device is determined based on the count value.

8. The apparatus of claim 1, further comprising a power voltage detector electrically coupled to the controller and configured to determine the first voltage value in the energy storage device and the second voltage value in the energy storage device.

9. The apparatus of claim 1, wherein the second voltage value is associated with a minimum operating voltage of the controller.

10. The apparatus of claim 1, further comprising a reference resistor having a known resistance value.

11. The apparatus of claim 10, wherein the variable resistance of the conductive portion of the resistance-based sensing device is determined based at least in part on a reference time interval associated with a reference voltage drop in the energy storage device in an instance in which the stored energy from the energy storage device is transmitted to the reference resistor.

12. The apparatus of claim 1, further comprising a transceiver radio electrically coupled to the controller.

13. The apparatus of claim 12, wherein the time interval associated with the voltage drop in the energy storage device representing the variable resistance of the conductive portion of the resistance-based sensing device is transmitted by the transceiver radio.

14. The apparatus of claim 1, wherein the variable resistance of the conductive portion of the resistance-based sensing device is determined without the use of an analog-to-digital converter.

15. A computer-implemented method for determining a variable resistance of a conductive portion of a resistance-based sensing device, the computer-implemented method comprising:
- transmitting, by a controller, stored energy from an energy storage device to the conductive portion of the resistance-based sensing device;
- determining a time interval associated with a voltage drop in the energy storage device from a first voltage value to a second voltage value; and
- determining the variable resistance of the conductive portion of the resistance-based sensing device based at least in part on the time interval associated with the voltage drop in the energy storage device.

16. The computer-implemented method of claim 15, further comprising:
- determining a count value based on a low power timer electrically coupled to the controller and configured to increment the count value based on a clock frequency of the controller, wherein the time interval associated with the voltage drop in the energy storage device is determined based on the count value.

17. The computer-implemented method of claim 15, further comprising a power voltage detector electrically coupled to the controller and configured to determine a voltage value in the energy storage device.

18. The computer-implemented method of claim 17, further comprising:
- determining, by the power voltage detector, the first voltage value and the second voltage value,
  - wherein the voltage drop corresponds to a difference between the first voltage value and the second voltage value, and
  - wherein the second voltage value is associated with a minimum operating voltage of the controller.

19. A computer program product for determining a variable resistance of a conductive portion of a resistance-based sensing device, the computer program product comprising at least one non-transitory computer-readable storage medium having computer-readable program code portions stored therein, the computer-readable program code portions comprising an executable portion configured to:
- transmit, by a controller, stored energy from an energy storage device to the conductive portion of the resistance-based sensing device;
- determine a count value based on a low power timer electrically coupled to the controller and configured to increment the count value based on a clock frequency of the controller;
- determine a time interval associated with a voltage drop in the energy storage device based at least in part on the count value from a first voltage value to a second voltage value; and
- determine the variable resistance of the conductive portion of the resistance-based sensing device based at least in part on the time interval associated with the voltage drop in the energy storage device.

* * * * *